United States Patent [19]
Sasaki

[11] Patent Number: 6,084,463
[45] Date of Patent: Jul. 4, 2000

[54] FUSE CIRCUIT

[75] Inventor: Masao Sasaki, Tokyo, Japan

[73] Assignee: Oki Electric Industry Co., Ltd., Tokyo, Japan

[21] Appl. No.: 09/092,908

[22] Filed: Jun. 8, 1998

[30] Foreign Application Priority Data

Sep. 12, 1997 [JP] Japan .................................. 9-248870

[51] Int. Cl.[7] ................................................ H03K 47/693

[52] U.S. Cl. .............................................. 327/525; 365/96

[58] Field of Search .............................. 327/525; 365/96, 365/225.7; 326/38, 41

[56] References Cited

U.S. PATENT DOCUMENTS

| | | | |
|---|---|---|---|
| 4,686,384 | 8/1987 | Harvey et al. | 327/525 |
| 5,585,759 | 12/1996 | Lee | 327/525 |
| 5,905,401 | 5/1999 | Sher | 327/525 |

*Primary Examiner*—Tuan T. Lam
*Attorney, Agent, or Firm*—Jones Volentine, L.L.P.

[57] ABSTRACT

An LSI is formed with two signal I/O circuits for generating signals supplied to an internal circuit in the LSI to reduce a developing period of the LSI, and a fuse is provided between a pad connected to the internal circuit and each signal I/O circuit. When supplying the internal circuit with an output signal of the signal I/O circuit, the fuse is fused by applying a voltage between specified pads. Midway steps in a device manufacturing process can be thereby made common, and the LSI can be efficiently developed.

12 Claims, 4 Drawing Sheets

(b)

(a)

FUSE CIRCUIT

BACKGROUND OF THE INVENTION

The present invention relates to a fuse circuit, provided in a semiconductor integrated circuit (hereinafter abbreviated to an LSI) and having a wiring pattern and a fuse connected between the wiring patter and a pad, for setting a signal on the pad in a fused status of the fuse.

FIGS. 2(a) and 2(b) are views each showing a configuration of a principal portion of a conventional fuse circuit. FIG. 2(a) is a plan view of the fuse circuit. FIG. 2(b) is a view showing a circuit in FIG. 2(a).

This fuse circuit is formed on the LSI, and includes two pads 1, 2, a wiring pattern 3 and a fuse 4. The wiring pattern 3 constitutes, e.g., a ground line or a power supply line. Connected to this wiring pattern 3 are the pad 1 and one end of the fuse 4. The other end of the fuse 4 is connected to the pad 2.

In the fuse circuit shown in FIG. 2, in a state where the fuse 4 is not fused, a ground potential GND or a power supply potential Vcc given via the fuse 4 and the pad 2 as well is supplied to an unillustrated flip-flop connected to the pad 2. If the flip-flop connected to the pad 2 is not supplied with the ground potential GND or the power supply potential Vcc via the pad 2, a voltage is applied between the pad 1 and the pad 2. The fuse 4 is fused upon applying the voltage. When the fuse 4 is fused, the flip-flop is supplied with the power supply potential Vcc or the ground potential GND, logic data opposite to the case where the fuse 4 is not fused, is outputted.

There arises, however, the following problem inherent in the prior art fuse circuit.

The prior art fuse circuit has no alternative but to determine whether to disconnect one pad 2 of the LSI from the wiring pattern 3 or to introduce the signal from the wiring pattern directly into the flip-flop via the pad 2, depending on whether the fuse 4 should be fused or not. Namely, it is unfeasible to make the signal flow to the flip-flop via the pad 2 by selecting a plurality of signals. Actualization of this involves preparing a mask pattern for forming a wiring pattern different from the on shown in FIG. 2, and forming a new wiring pattern different from the one in FIG. 2 by use of the mask pattern. Therefore, development of the product is time-consuming, and there is no effect in terms of a mass-production of the LSIs.

SUMMARY OF THE INVENTION

To accomplish the above object, according to a first aspect of the present invention, a fuse circuit is provided on an LSI formed with an arbitrary number of internal circuits and a plurality of signal I/O circuits for outputting and inputting signals to be inputted and outputted to the internal circuits. The fuse circuit is constructed in the way which follows.

To be specific, the fuse circuit comprises an arbitrary number of first signal lines, connected to an arbitrary number of internal circuits, for transmitting the signal to the internal circuits, an arbitrary number of first pads so formed as to be connected to the arbitrary number of first signal lines, and a plurality of fuses provided corresponding respectively to the signal I/O circuits, one ends of which are connected to the arbitrary number of first pads. The fuse circuit further comprises a plurality of second signal lines, connected respectively between the other ends of the fuses and the signal I/O circuits, for respectively transmitting the signals, and a plurality of second pads provided corresponding respectively to the signal I/O circuits and connected to the first pads via the fuses corresponding to the individual signal I/O circuits. Then, the respective fuses are fused with voltages selectively applied to the first pads and the second pads that are connected to the fuses.

According to a second aspect of the invention, the fuse circuit is constructed as follows. Namely, the fuse circuit according to the second aspect of the invention comprises n internal circuit, a first signal line for inputting a first signal via a first fuse to the internal circuit, and a second signal line for inputting to the internal circuit a second signal via a second fuse. Then, the first and second fuses are selectively fused, and the first or second signal is selectively supplied to the internal circuit.

According to the first aspect of the invention, the fuse circuit is constructed as described above, and hence, when selecting a desired signal I/O circuit among the plurality of signal I/O circuits formed on the LSI and inputting, and when inputting and outputting the signals between the internal circuit and the desired signal I/O circuit, the fuse corresponding to the signal I/o circuit other than the desired signal I/O circuit, is fused by applying the voltage between the first pad and the second pad connected to the same fuse. Only the desired signal I/O circuit is thereby connected to the internal circuit through the second signal line, the first pad and the first signal line. Accordingly, the problem given above can be obviated.

DETAILED DESCRIPTION OF THE PREFERRED EMBODIMENTS

First Embodiment

Figure 1:
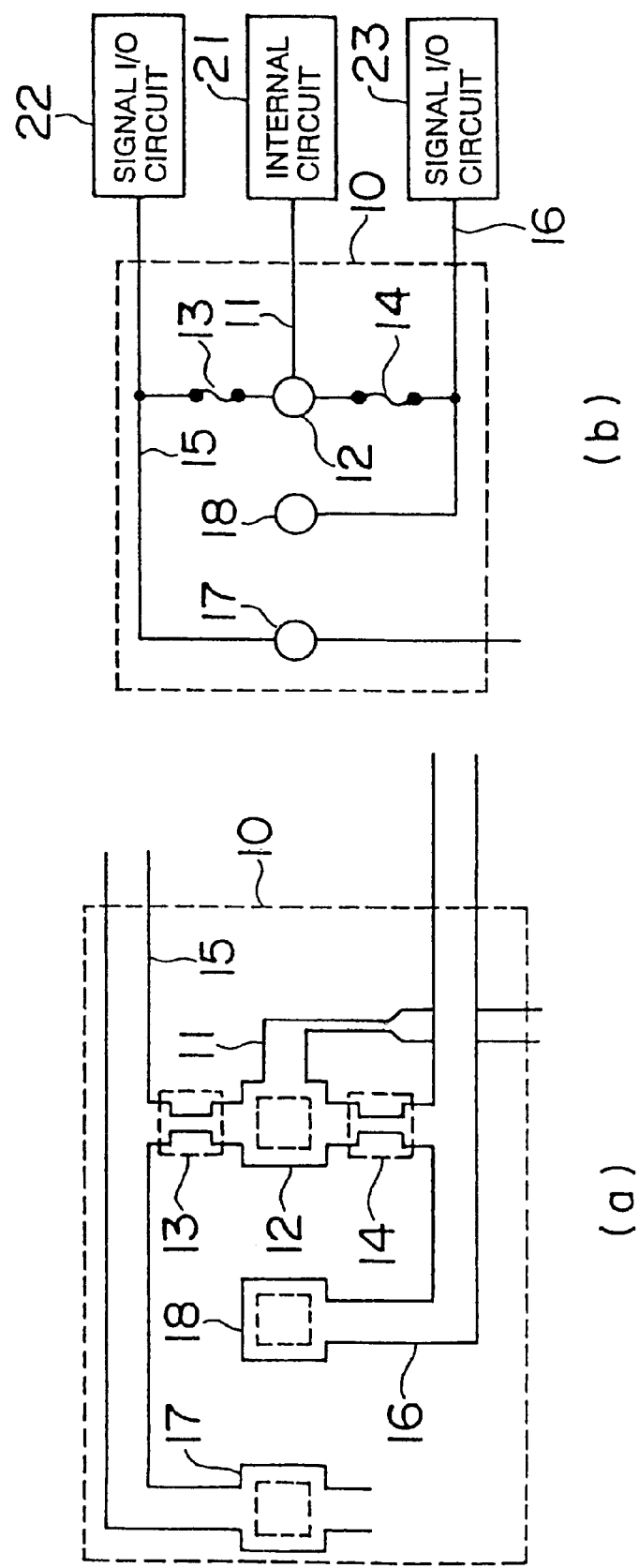
FIGS. 1(a) and 1(b) are a view showing a construction of a principal portion of a fuse circuit in a first embodiment of the present invention.
Figure 2:
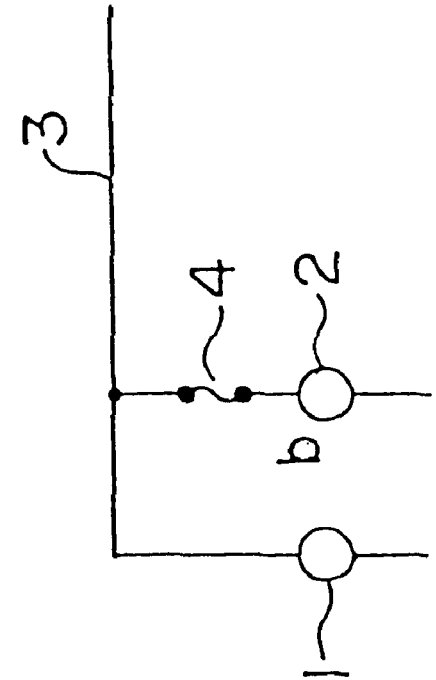
FIGS. 2(a) and 2(b) are a view illustrating a construction of a principal portion of a prior art fuse circuit.
Figure 2:
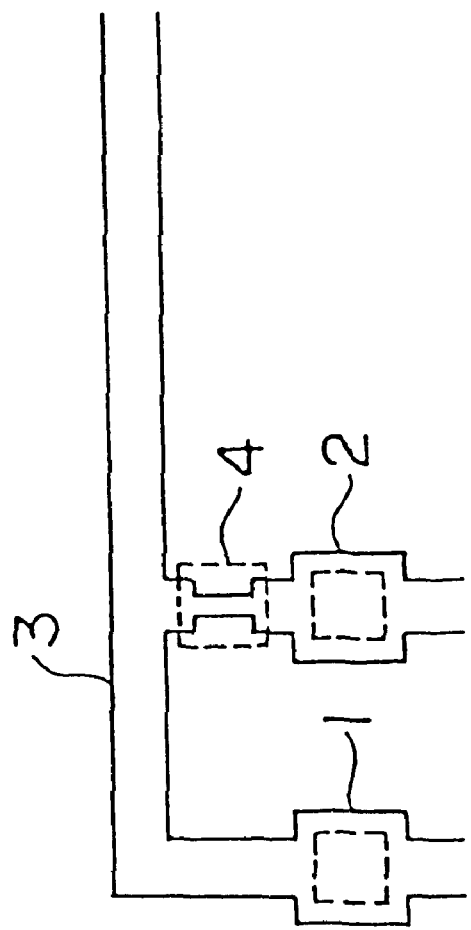

FIGS. 1(a) and 1(b) are views each showing a configuration of a principal portion of a fuse circuit in a first embodiment of the present invention. FIG. 1(a) is plan view. FIG. 1(b) is a view illustrating a circuit in FIG. 1(a).

This fuse circuit 10 is formed on an LSI, and includes a first signal line 11 composed of a wiring pattern of, e.g., aluminum etc. The signal line 11. A first pad 12 is connected to the signal line 11, and one ends of two fuses 13, 14 are connected to the pad 12. Each of the fuses 13, 14 is formed thin of aluminum, Nichrome or polysilicon etc.

Second signal lines 15, 16, to which the signal line 11 is connected, are connected to the other ends of the respective fuses 13, 14, and second pads 17, 18 are also connected to the other ends of the same fuses. Each of the signal lines 15, 16 is also composed of a wiring pattern of, e.g., aluminum etc.

The LSI on which the fuse circuit 10 is formed includes an internal circuit 21 such as a logic circuit etc., and two signal I/O circuits 22, 23 for generating signals to be outputted to the internal circuit 21. The signal I/O circuits 22, 23 may be, e.g., clock circuits for generating timing signal assuming different phases, and logic circuits etc. for performing different logical developments. The signal line 15 is connected to the signal I/O circuit 22 and serves to transmit the signal generated by the signal I/O circuit 22 to the pad 12 via the fuse 13. The signal line 16 is connected to the signal I/O circuit 23 and serves to transmit the signal generated by the signal I/O circuit 23 to the pad 12 via the fuse 14. The signal line 11 is connected to the internal circuit 21 and serves to transmit the signal supplied through the pad 12 to the internal circuit 21.

The pads 17, 18 are provided corresponding to the signal I/O circuits 22, 23, and are constructed to, when a voltage is applied between the pad 12 and the pads 17, 18, make fusions of the fuses 13, 14 provided corresponding to these signal I/O circuits 22, 23.

This fuse circuit 10 incorporates a function of setting a signal supplied to the internal circuit 21 by selecting an output signal of the signal I/O circuit 22 or 23. A setting method thereof will be hereinafter be explained.

In the case of setting the signal supplied to the internal circuit via the pas 12 and the signal line 11 to the output signal of the signal I/O circuit 22, the voltage is applied between the pad 18 and the pad 12. Upon the application of the voltage, an over current flows across the fuse 14, and the fuse 14 is then fused, with the result that the signal I/O circuit 23 is disconnected from the pad 12. In this state, the pad 12 is brought into a state of this being connected to only the signal I/O circuit 22 via the fuse 13 and the signal line 15.

In contrast with the above-mentioned, in the case of setting the signal supplied to the internal circuit 21 to the output signal of the signal I/O circuit 23, the voltage is applied between the pad 17 and the pad 12. The over current thereby flows across the fuse 13 enough to fuse the fuse 13, whereby the signal I/O circuit 22 is disconnected from the pad 12. In this state, the pad 12 is brought into a state where only the signal I/O circuit 23 is connected to the pad 12 via the fuse 13 and the signal line 16.

In contrast with this, when setting the signal supplied to the internal circuit 21 to the output signal of the signal I/O circuit 23, the voltage is applied between the pad 17 and the pad 12. The over current thereby flows across the fuse 13 enough to fuse the fuse 13, with the result that the signal I/O circuit 22 is disconnected from the pad 12. In this state, the pad 12 comes into such a state that only the signal I/O circuit 23 is connected to the pad 12 through the fuse 14 and the signal line 16.

As discussed above, the fuse circuit in accordance with the first embodiment is constructed so that the fuses 13, 14 are provided between the pad 12 and the signal lines 15, 16, and the voltage is applied between the pad 12 and the pads 17, 18, whereby the fuses 13, 14 are fused. Any one of the fuses 13, 14 is fused by selectively applying the voltage between the pad 12 and the pads 17, 18, whereby the expected signal can be selectively supplied to the internal circuit 21. In the prior art fuse circuit, the wiring layer is restructured by creating other mask pattern, thus conducting a development of the LSI. In the fuse circuit 10 shown in FIGS. 1(a) and 1(b), however, two kinds of LSIs can be actualized simply by selectively fusing the fuses 13, 14, and it is feasible to reduce the costs for the development thereof and a development period as well. Further, when in the mass production, the LSI can be manufactured in the same process till the fuses 13, 14 are fused, and hence an effect in the mass production can be also obtained.

Second Embodiment

Figure 3:
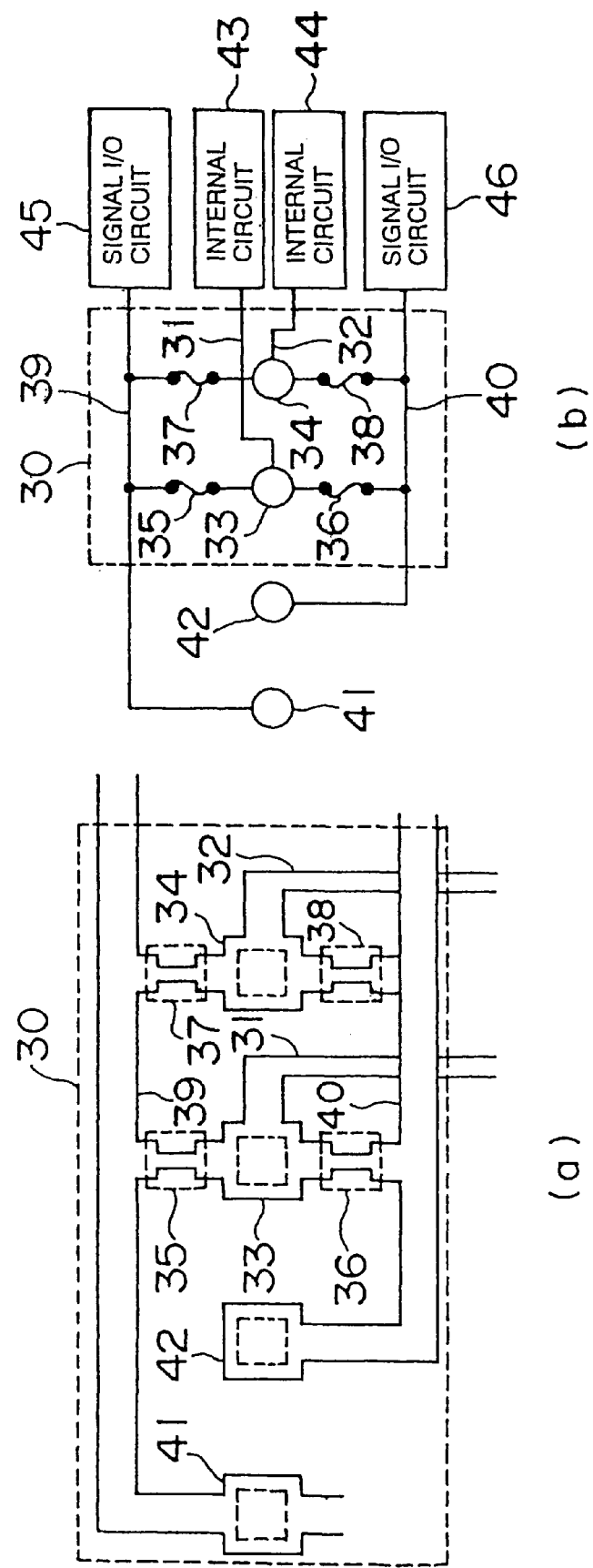
FIGS. 3(a) and 3(b) are a view showing a construction of a principal portion of the fuse circuit in a second embodiment of the present invention.

FIGS. 3(a) and 3(b) are views each illustrating a configuration of a principal portion of the fuse circuit in a second embodiment of the present invention. FIG. 3(a) is a plan view. FIG. 3(b) is a view showing the circuit in FIG. 3(a).

The first embodiment has deal with the case in which there is provided one internal circuit for selecting the input signal. The second embodiment will, however, deal with a case in which two internal circuits are provided.

A fuse circuit 30 in FIG. 3(a) is formed on the LSI and includes two signal lines 31, 32 corresponding to the first signal line 11 in the first embodiment. Each of the signal lines 31, 32 is composed of a wiring pattern of aluminum etc. First pads 33, 34 are connected respectively to the signal lines 31, 32. One ends of two fuses 35, 36 are connected to the pad 33, and one ends of two fuses 37, 38 are connected to the pad 34. Each of the fuses 35–37 is formed thin of aluminum, Nichrome or polysilicon etc.

Second lines 39, 40, to which each signal line 31 is connected, are connected to the other ends of the fuses 35, 36, and pads 41, 42 are connected respectively to the other ends of the fuses 35, 36. The signal lines 39, 40, to which each signal line 32 is connected, are connected respectively to the other ends of the fuses 37, 38. The signal lines 39, 40 are also each composed of the wiring pattern of, e.g., aluminum etc.

The LSI on which the fuse circuit 30 is formed includes two internal circuits 43, 44 such as logic circuits etc., and two signal I/O circuits 45, 46 for generating signals to be outputted to the internal circuits 43, 44. The signal line 39 is connected to the signal In/O circuit 45 and serves to transmit output signals from this signal In/O circuit 45 to the pads 33, 34 via the fuses 35, 37. The signal line 40 is connected to the signal IN/O circuit 46 and serves to transmit output signals from this signal In/O circuit 46 to the pads 33, 34 via the fuses 36, 38. The signal line 31 is connected to the internal circuit 43 and serves to transmit to the internal circuit 43 the signal supplied via the pad 33. The signal line 43 is connected to the internal circuit 44 serves to transmit to the internal circuit 44 the signal supplied via the pad 34.

The pad 41 is provided corresponding to the signal In/O circuit 45 and is constructed to, when the voltage is applied between the pads 41 and 42, fuse the fuses 35, 37 provided corresponding to the signal I/O circuit 45. The pad 42 is provided corresponding to the signal I/O circuit 46 and is constructed to, when the voltage is applied between the pads 41 and 42, fuse the fuses 36, 38 provided corresponding to the signal I/O circuit 46.

This fuse circuit 30 incorporates a function of setting the signal supplied to the internal circuit 43 to the output signal of the signal In/O circuit 45 or of the signal In/O circuit 46 as well as of setting the signal supplied to the internal circuit 44 to the output signal of the signal IN/O circuit 46 or of the signal I/O circuit 46. A setting method thereof will hereinafter be discussed.

When setting the signal supplied to the internal circuit 43 via the pad 33 and the signal 31 to the output signal of the signal I/O circuit 45 and setting the signal supplied to the internal circuit 44 via the pad 34 and the signal line 32 to the output signal of the signal I/O circuit 46, the voltage is applied between the pad 33 and the pad 42 and next between the pad 34 and the pad 41. Upon the voltage applications, the over currents flow enough to fuse the fuses 36, 37. As a result, the pad 33 is disconnected from the signal In/O circuit 46, and the pad 34 is also disconnected from the signal IN/O circuit 45. Hence, only the signal IN/O circuit 45 is connected to the pad 33 through the fuse 35 and the signal line 39, and it follows that the output signal of the signal I/O circuit 45 is inputted to the internal circuit 43. Further, only the signal I/O output circuit 46 is connected to the pad 34 through the fuse 38 and the signal line 40, and it follows that the output signal of the signal I/O circuit 46 is inputted to the internal circuit 44.

When setting the signal supplied to the internal circuit 43 via the pad 33 and the signal line 31 to the output signal of the signal I/O circuit 46 and setting the signal supplied to the internal circuit 44 via the pad 34 and the signal line 32 to the output signal of the signal I/O circuit 45, the voltage is applied between the pad 33 and the pad 41 and next between the pad 34 and the pad 42. Upon these voltage applications, the over currents flow enough to fuse the fuses 35, 38. As a consequence, the pad 33 is disconnected from the signal In/O circuit 45, and the pad 34 is also disconnected from the signal In/O circuit 46. Therefore, only the signal In/O circuit 46 is connected to the pad 33 through the fuse 36 and the signal line 40, and it follows that the output signal of the signal I/O circuit 46 is inputted to the internal circuit 43. Further, only the signal I/O output circuit 45 is connected to the pad 34 through the fuse 37 and the signal line 39, and it follows that the output signal of the signal I/O circuit 45 is inputted to the internal circuit 44.

When setting the signal supplied to the internal circuit 43 via the pad 33 and the signal line 31 and the signal supplied to the internal circuit 44 via the pad 34 and the signal line 32 to the output signal of the signal In/O circuit 45, the voltage is applied between the pad 33 and the pad 42 and next between the pad 34 and the pad 42. Upon these voltage applications, the over currents flow enough to fuse the fuses 36, 38. As a consequence, the pad 33 is disconnected from the signal In/O circuit 46, and the pad 34 is also disconnected from the signal In/O circuit 46. Therefore, only the signal In/O circuit 45 is connected to the pad 33 through the fuse 35 and the signal line 39, and it follows that the output signal of the signal I/O circuit 45 is inputted to the internal circuit 43. Further, only the signal I/O output circuit 45 is connected to the pad 34 through the fuse 37 and the signal line 39, and it follows that the output signal of the signal I/O circuit 45 is inputted to the internal circuit 44.

When setting the signal supplied to the internal circuit 43 via the pad 33 and the signal line 31 and the signal supplied to the internal circuit 44 via the pad 34 and the signal line 32 to the output signal of the signal In/O circuit 46, the voltage is applied between the pad 33 and the pad 41 and next between the pad 34 and the pad 41. Upon these voltage applications, the over currents flow enough to fuse the fuses 35, 37. As a consequence, the pad 33 is disconnected from the signal I/O circuit 45, and the pad 34 is also disconnected from the signal I/O circuit 45. Therefore, only the signal I/O circuit 46 is connected to the pad 33 through the fuse 36 and the signal line 40, and it follows that the output signal of the signal I/O circuit 46 is inputted to the internal circuit 43. Further, only the signal I/O output circuit 46 is connected to the pad 34 through the fuse 38 and the signal line 40, and it follows that the output signal of the signal I/O circuit 46 is inputted to the internal circuit 44.

As discussed above, in the fuse circuit 30 in the second embodiment is constructed so that the voltages can be independently applied between the pads 41, 42 and the pads 33, 34 by respectively providing the signal lines 31, 32 for transmitting the signals to the two internal circuits 43, 44 with the pads 33, 44 and also providing the fuses 35–38 between the pads 33, 34 and the signal lines 39, 40. Hence, the fuses 35–38 can be selectively fused by executing the selective voltage applications between the pads 41, 42 and the pads 33, 34, and the expected signals can be supplied to the internal circuits 43, 44, respectively. In the prior art fuse circuit, the wiring layer is restructured by creating other mask pattern, thus conducting the development of the LSI. In the fuse circuit 30 shown in FIGS. 3(a) and 3(b), however, plural kinds of LSIs can be actualized simply by selectively fusing the fuses 35–38, and it is feasible to reduce the costs for the development thereof and the development period as well. Further, when in the mass production, the LSI can be manufactured in the same process till the fuses 35–38 are fused, and hence the effect in the mass production can be also obtained.

Second Embodiment

Figure 4:
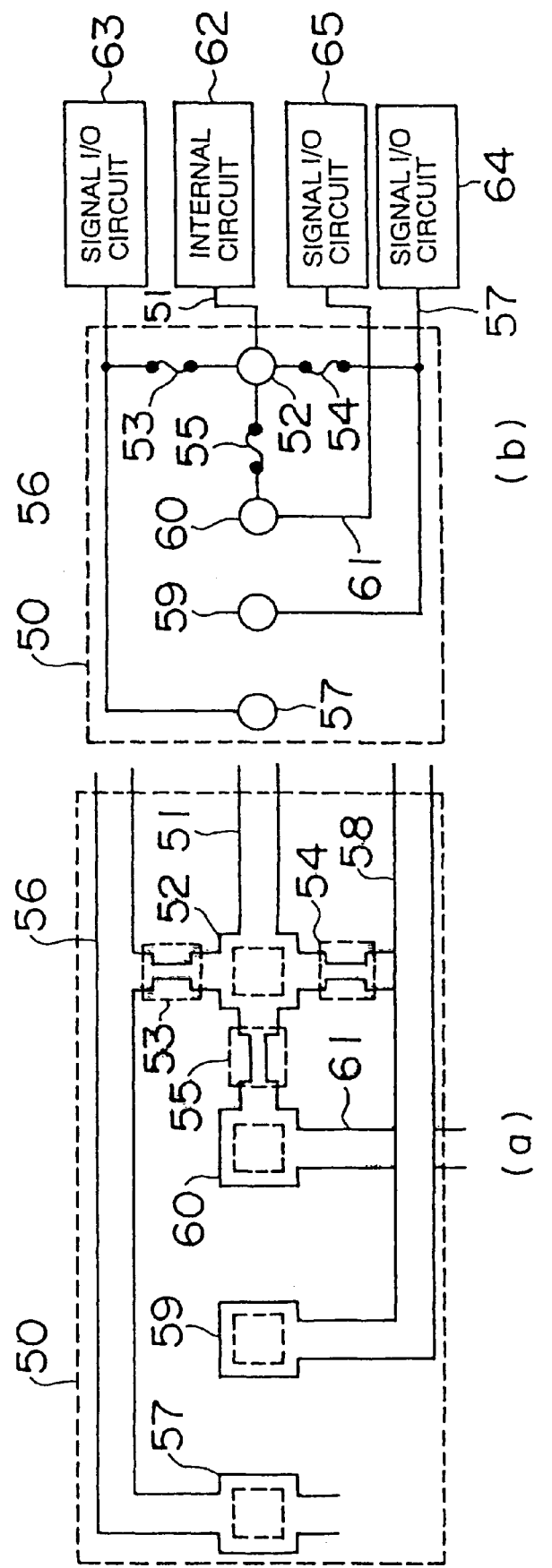
FIGS. 4(a) and 4(b) are a view showing a construction of a principal portion of the fuse circuit in a third embodiment of the present invention.

FIGS. 4(a) and 4(b) are views each showing a construction of a principal portion of a fuse circuit in a third embodiment of the present invention. FIG. 4(a) is a plan view thereof. FIG. 4(b) is a view showing a circuit in FIG. 4(a).

The first embodiment has dealt with the case of providing the two signal I/O circuits for outputting the signals to the internal circuits. The third embodiment will, however, deal with a case in which three signal I/O circuits are provided.

A fuse circuit 50 in FIG. 4(a) is formed on the LSI and includes a first signal line 51. The signal line 51 is composed of a wiring pattern of aluminum etc. A first pad 52 is connected to this signal line 51. One ends of three fuses 53, 54, 55 are connected to the pad 52. Each of the fuses 53–55 is formed thin of aluminum, Nichrome or polysilicon etc.

A second line 56, to which the signal line 51 is connected, is connected to the other end of the fuse 53, and a second pad 57 is connected to the other end of the fuse 53. Connected to the other end of the fuse 54 are the second signal line 58 and the second pad 59. A second pad 60 is connected to the other end of the fuse 55, and a second signal line 61 is connected to the pad 60. Each of the signal lines 56, 58, 61 is also composed of a wiring pattern of, e.g., aluminum etc.

The LSI on which the fuse circuit 50 is formed includes an internal circuit 62 such as, e.g., a logic circuit etc., and three signal I/O circuits 63, 64, 65 for generating signals to be outputted to the internal circuit 62. The signal line 56 is connected to the signal I/O circuit 63 and serves to transmit an output signal from this signal I/O circuit 63 to the pad 52 via the fuse 53. The signal line 57 is connected to the signal I/O circuit 64 and serves to transmit the output signal of the signal I/O circuit 64 to the pad 52 via the fuse 54. The signal line 51 is connected to the internal circuit 62 and serves to transmit the signal supplied via the pad 52 to the internal circuit 62.

The pad 57 is provided corresponding to the signal I/O circuit 63 and is constructed to, when the voltage is applied between the pad 57 and each pad 52, fuse the fuse 53 provided corresponding to the signal I/O circuit 46. The pad 59 is provided corresponding to the signal I/O circuit 64 and is constructed to, when the voltage is applied between the pad 59 and the pad 52, fuse the fuse 54 provided corresponding to the signal I/O circuit 64. The pad 57 is provided corresponding to the signal I/O circuit 63 and is constructed to, when the voltage is applied between the 57 and each pad 52, fuse the fuse 53 provided corresponding to the signal I/O circuit 46. The pad 60 is provided corresponding to the signal I/O circuit 65 and is constructed to, when the voltage is applied between the pad 60 and the pad 52, fuse the fuse 55 provided corresponding to the signal I/O circuit 65.

This fuse circuit 50 has a function of alternatively setting the signal supplied to the internal circuit 62 to the output signal of the signal I/O circuits 63–65. A setting method thereof will hereinafter be described.

In the case of setting the signal supplied to the internal circuit 62 via the pad 52 and the signal line 51 to the output signal of the signal I/O circuit 63, the voltage is applied between the pad 52 and the pads 59, 60. With this voltage application, the over current flows enough to fuse the fuses 54, 55. Therefore, the pad 52 is disconnected from the signal I/O circuits 64, 65, and only the signal I/O circuit 63 is connected to the pad 52 via the fuse 53 and the signal line 56. Then, it follows that the output signal of the signal I/O circuit 63 is inputted to the internal circuit 62.

In the case of setting the signal supplied to the internal circuit 62 via the pad 52 and the signal line 51 to the output signal of the signal I/O circuit 64, the voltage is applied between the pad 52 and the pads 57, 60. With this voltage application, the over current flows enough to fuse the fuses 53, 55. Therefore, the pad 52 is disconnected from the signal I/O circuits 63, 65, and only the signal I/O circuit 64 is connected to the pad 52 via the fuse 53 and the signal line 57. Then, it follows that the output signal of the signal I/O circuit 64 is inputted to the internal circuit 62.

In the case of setting the signal supplied to the internal circuit 62 via the pad 52 and the signal line 51 to the output signal of the signal I/O circuit 65, the voltage is applied between the pad 52 and the pads 57, 59. With this voltage application, the over current flows enough to fuse the fuses 53, 54. Hence, the pad 52 is disconnected from the signal I/O circuits 63, 64, and only the signal I/O circuit 65 is connected to the pad 52 via the fuse 55 and the signal line 61. Then, it follows that the output signal of the signal I/O circuit 65 is inputted to the internal circuit 62.

As discussed above, in the fuse circuit 50 in the third embodiment is constructed so that the voltages can be independently applied between the 10 pads 57, 59, 60 and the pad 52 by providing the pad 52 connected to the signal line 51 with the fuses 53–55 and the pads 57, 59, 60 that correspond respectively to the signal I/O circuits 63–65. Hence, the fuses 53–55 are selectively fused by the selective voltage application between the pad 52 and the pads 57, 59, 60, whereby the expected signal can be supplied to the internal circuit 62 by selecting one of the threes. Therefore, in the prior art fuse circuit, the wiring layer is restructured by creating other mask pattern, thus conducting the development of the LSI. In the fuse circuit 50 shown in i FIGS. 4(*a*) and 4(*b*), however, plural kinds of LSIs can be actualized simply by selectively fusing the fuses 53–55, and it is feasible to reduce the costs for the development thereof and the development period as well. Further, when in the mass production, the LSI can be manufactured in the same process till the fuses 53–55 are fused, and hence the effect in the mass production can be also obtained.

Note that the present invention is not limited to the embodiments discussed above but may be modified in a variety of forms. The modifications thereof are exemplified as follows.

(1) The first through third embodiments have dealt with the construction that the signals outputted from the signal I/O circuits 22, 23, 45, 46 and 63–65 are inputted to the internal circuits 21, 43, 44, 62. The present invention can be, however, applied to a case in which the signals outputted by the internal circuits 21, 43, 44, 62 are to be inputted to the signal I/O circuits 22, 23, 45, 46 and 63–65.

(2) The second embodiment has the construction that the signals inputted to the two internal circuits 43, 44 are selected from the output signals of the two signal I/O circuits 45, 46. If the number of circuits corresponding to the pad 33 and to the fuses 35, 36 is increased, however, the number of the internal circuits 43, 44 can be arbitrarily incremented.

(3) The third embodiment has dealt with the construction of having the three signal I/O circuits 63–65, however, the number of the signal I/O circuits 63–65 can be arbitrarily incremented by further increasing the number of the fuses 53–55.

As discussed above in detail, the construction according to the first aspect of the invention is that the fuses are provided respectively between the first pad connected to an arbitrary number of internal circuits and the second signal line for transmitting the signals to the plurality of signal I/O circuits, there are provided the plurality of second pads corresponding to the plurality of signal I/O lines, and the respective fuses are fused based on the voltage applied selectively to the second pad and the first pad. Hence, the expected signal is selected and cal be supplied to the internal circuit without restructuring the LSI. It is therefore feasible to reduce the developing period of the LSI and obtain the effect in the mass production.

What is claimed is:

1. A fuse circuit comprising:

one or two or more first signal lines, provided in a semiconductor integrated circuit in which to form one or two or more internal circuits and a plurality of signal I/O circuits for inputting and outputting signals to be inputted and outputted to or from said internal circuits, and connected to said one or two more internal circuits, for transmitting the signals;

one or two or more first pads so formed as to be connected to said one or two or more first signal lines;

a plurality of fuses, provided corresponding respectively to said signal I/O circuits. one ends of which are each connected to said one or two or more first pads;

a plurality of second signal lines, each correspondingly connected to the other end of said fuses and said signal I/O circuits for transmitting the signals; and a plurality of second pads each connected corresponding to said signal I/O circuits and connected to said first pads via said fuses, wherein each of said fuses is fused by selectively applying a voltage to said first pads and said second pads connected to said fuses, and any one of said signal I/O circuits selectively connected to any one of said internal circuits.

2. A fuse circuit according to claim 1, wherein said internal circuits are logic circuits.

3. A fuse circuit according to claim 1, wherein any one of the plurality of fuses is fused selectively by supplying a voltage between pads connected to the fuse to be fused.

4. A fuse circuit according to claim 1, wherein the plurality of fuses comprise a conductive line respectively, the width of each conductive line is thinner than the width of the first and second signal lines.

5. A fuse circuit according to claim 1, wherein said internal circuits are clock circuits.

6. A fuse circuit comprising:

an internal circuit;

a first pad connected the internal circuit;

a first node supplied a first signal;

a first fuse connected between the first node and the first pad;

a second node supplied a second signal;

a second fuse connected between the second node and the first pad;

a second pad connected the first node; and a third pad connected the second node.

7. A fuse circuit according to claim 6, further comprising:

one or more third nodes supplied with a third signal;

one or more third fuses, provided corresponding respectively to each of said third nodes, each of said third fuses connected between a corresponding one of said third nodes and the first pad, one or more fourth pads, provided corresponding respectively to each of said third nodes, each of said fourth pads connected to a corresponding one of said third nodes.

8. A fuse circuit according to claim 6, wherein the first or the second fuse is fused selectively by supplying a voltage between pads connected to the fuse to be fused.

9. A fuse circuit according to claim 6, wherein the first and the second fuses comprise a conductive line respectively, a width of each conductive line is thinner than a width of a first signal line supplying the first signal to the first node and a second signal line supplying a second signal to the second node.

10. A fuse circuit comprising:

a plurality of internal circuits;

a first line to which a first signal is input;

a second line to which a second signal is input;

a first pad connected to the first line;

a second pad connected to the second line;

a plurality of third pads, each of said third pads connected to a corresponding one of said internal circuits respectively;

a plurality of first fuses, each of said first fuses provided corresponding to each of said plurality of third pads respectively, one end of each of said first fuses connected to the first line and the other end of each of said first fuses connected to a corresponding one of said third pads;

a plurality of second fuses, each of said second fuses provided corresponding to each of said third pads respectively one end of each of said second fuses connected to the second line and the other end of each of said second fuses connected to the a corresponding one of said third pads.

11. A fuse circuit according to claim 10, wherein the first fuses or the second fuses are fused selectively by supplying a voltage between pads connected to a fuse to be fused.

12. A fuse circuit according to claim 10, wherein the first fuses and the second fuses comprise a conductive line respectively, the width of each conductive line is thinner than the width of the first and second lines.

* * * * *